United States Patent [19]

Keefe et al.

[11] 3,996,572
[45] Dec. 7, 1976

[54] VERY HIGH DENSITY GAPLESS PROPAGATION STRUCTURE FOR BUBBLE DOMAINS

[75] Inventors: George E. Keefe, Montrose; Yeong S. Lin, Mount Kisco, both of N.Y.; Laurence L. Rosier, San Jose, Calif.

[73] Assignee: International Business Machines Corporation, Armonk, N.Y.

[22] Filed: May 13, 1975

[21] Appl. No.: 576,950

Related U.S. Application Data

[63] Continuation of Ser. No. 428,972, Dec. 27, 1973, abandoned.

[52] U.S. Cl. .................. 340/174 TF; 340/174 RC
[51] Int. Cl.² ....................................... G11C 11/14
[58] Field of Search ............................ 340/174 TF

[56] References Cited

UNITED STATES PATENTS

| | | | |
|---|---|---|---|
| 3,824,568 | 7/1974 | Fischer | 340/174 TF |
| 3,828,329 | 8/1974 | Fischer | 340/174 TF |

Primary Examiner—James W. Moffitt
Attorney, Agent, or Firm—Sughrue, Rothwell, Mion, Zinn & Macpeak

[57] ABSTRACT

The undulating longitudinal edge of a continuous elongated structure of magnetic material forms a bubble domain propagation path for implementing the continuous movement of magnetic bubble domains under the control of a reorienting in-plane magnetic field. The domains propagate along the periphery of the undulating layer, with the periphery preferably taking the form of linked outwardly convex semi-circles. The structure can be comprised of a magnetically soft material, such as permalloy, or be an implanted region in the magnetic material which supports the bubble domains.

14 Claims, 4 Drawing Figures

VERY HIGH DENSITY GAPLESS PROPAGATION STRUCTURE FOR BUBBLE DOMAINS

This is a continuation of application Ser. No. 428,972, filed Dec. 27, 1973 now abandoned.

BACKGROUND OF THE INVENTION

1. Field of the Invention

This invention relates to magnetic bubble domains, and more particularly, to gapless propagation structures for implementing the controlled movement of magnetic bubble domains in a supporting medium.

2. Description of the Prior Art

In the new and rapidly developing field of technology relating to magnetic bubble domains, the preferred means for implementing the controlled movement of bubbles within a supporting magnetic medium, such as orthoferrite or garnet material, has involved the use of overlay strips of permalloy or the like. These strips are magnetically soft, are adjacent to the medium, and serve to channel and concentrate the flux from a rotating in-plane magnetic field. This concentration produces poles at the ends of the strips when aligned with the rotating field, and these poles attract (or repel) the bubbles to thereby control their movement.

The permalloy structures currently in use include the T-I bar, Y-I bar, Y-Y bar and chevron patterns, and rely on gaps between the bars to provide a continuous flow of bubbles around the structures in the presence of a rotating or pulse-sequenced magnetic field.

These gapped permalloy patterns are characterized by a number of major disadvantages. For instance, the bubble shape is dramatically distorted at the gaps which reduces the operating margins. Further, a bubble typically comes to a stop at the gaps which reduces the average propagation velocity and thus the data rate. In addition, a bubble must be elevated to a high energy state to traverse the gap, which renders it momentarily less stable and thus more likely to collapse, split or otherwise behave in an erratic manner. Finally, the close dimensional tolerances that must be maintained at the gaps makes the propagation of the permalloy overlays more difficult and increases the likelihood of serious propagation errors occurring at the gaps.

Several propagation structures which are generally of a gapless form have been proposed in the prior art, as typified by U.S. Pat. No. 3,516,077 (tangent discs on alternately opposite sides of a platelet), U.S. Pat. No. 3,518,643 (zig-zag strip), and U.S. Pat. No. 3,644,908 (sinuous magnetically hard strip alongside a straight strip). All of these structures have a number of disadvantages, however, such as low packing density and the ability to implement bubble domain movement in only a single direction.

Accordingly, it is a primary object of this invention to provide an improved bubble domain propagation structure which can be used to provide high density storage.

It is another object of this invention to provide magnetic bubble domain propagation by a high density structure which is easily fabricated.

It is a further object of this invention to provide an improved gapless propagation structure for movement of magnetic bubble domains in a supporting magnetic medium.

SUMMARY OF THE INVENTION

This invention is directed to a gapless propagation structure of permalloy or the like which enables the continuous movement of magnetic bubbles along a predetermined path in response to an in-plane rotating or pulse-sequenced magnetic field.

In a first embodiment of the invention, the permalloy structure constitutes a continuous elongated layer of magnetically soft material having at least one undulating longitudinal edge and the domains propagate along the undulating edge. Preferably, the edge takes the form of outwardly convex linked semi-circles. In a closed loop strip, opposed undulations form linked stages or cells of a size W times 2W where: W is the width of the line of the propagating circuit and the distance between the opposed undulations is equal to 2W while the diameter of each of the opposed semi-circular edge portions forming the cell is equal to W.

In a second embodiment of similar configuration and dimension, the layer of magnetically soft material is characterized by axially spaced cavities inside the propagation channel defined by the undulating edges. Preferably, each cavity comprises a circular hole aligned with the intersection points of adjacent semi-circles and centered between the undulating edges.

Although permalloy structures are used to illustrate the propagation means, this means can also be achieved by ion implanted regions of the bubble domain material, in a manner well known in the magnetic bubble domain art.

The foregoing and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
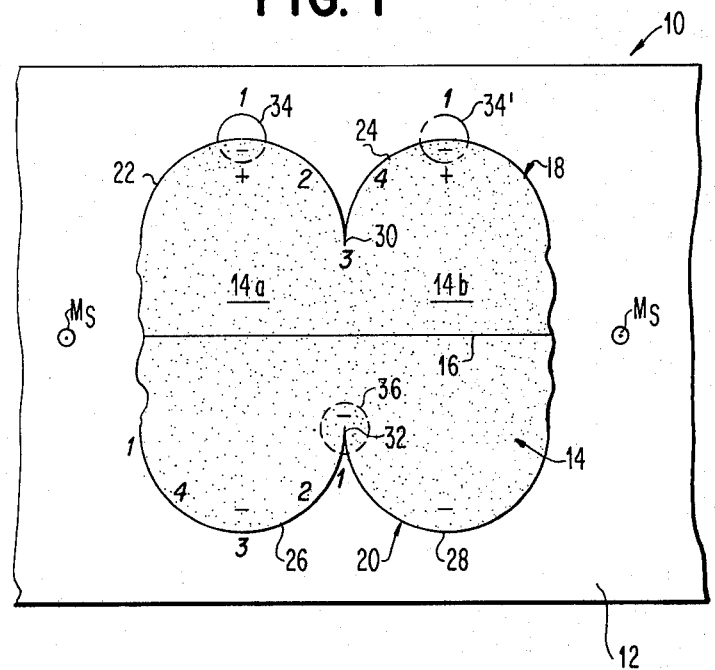
FIG. 1 is a top plan view of a gapless propagation structure in accordance with the first embodiment of the invention.

Referring to the drawings, FIG. 1 illustrates a domain propagation arrangement as indicated generally at 10 comprising a sheet or platelet 12 of material of orthoferrite, garnet or the like, in which single wall domains may be moved, and extending across the upper surface of platelet 12 is a strip 14 of permalloy or other magnetically soft material in such a manner that the longitudinal axis 16 of the strip extends horizontally in the Figure. For the purpose of description and understanding, a magnetic field of sufficient magnitude to support bubble domains within platelet 12 extends through the platelet 12 and normal thereto as indicated by arrowheads $M_S$. The permalloy strip may be formed directly on the surface of the platelet, or may be slightly spaced therefrom by an insulating layer. The strip 14 of permalloy is characterized by having oppositely undulating longitudinal edges 18 and 20, at the top and the bottom, respectively, which form bubble domain propagation paths permitting the bubbles to move along the strip periphery and generally in either direction parallel to the longitudinal axis 16. It is seen, that the undulations of respective edges 18 and 20 are in phase, that is, their peaks and valleys coincide longitudinally. As illustrated, the undulations are in the form of linked semi-circles as at 22 and 24 for instance for upper edge 18 and as at 26 and 28 for lower edge 20. Further, the intersection 30 of the upper edge semi-circular portions 22 and 24 is in alignment with the intersection 32 of the semi-circular portions 26 and 28 of the lower edge 20. Further, the semi-circular portions in terms of their diameters and their lateral spacing have a particular relationship.

The diameter of the bubbles or domains can be readily controlled by varying the intensity of the applied magnetic field and to miniaturize the bubble domain device or arrangement, the diameters of the domains can be reduced without great difficulty. However, it must be realized that domains can be obtained with diameters far smaller than the smallest line width of propagating circuits and thus the ultimate limitation for miniaturization is the lithography of the propagating circuit rather than the bubble size. In contrast, the existing T-bar, I-bar and Y-bar circuits are under the constraint that the bubble diameter should be equal to twice the line width W and no one bubble can be closer to another than a distance equal to four bubble diameters. Thus, there results a typical cell of 8W times 8W limiting miniaturization of the domain device employing propagation elements of this type. However, in the instant invention, each cell as defined by the opposed semi-circular edge portions such as 22 and 26 and the permalloy strip material therebetween permits the diameter of the linked semi-circles to be equal to the line width W and thus a cell size as defined by the opposing semi-circles and the strip material therebetween comprises an area W times 2W. This allows the interaction between bubbles (being of like polarity) to keep the bubbles from moving closer to each other due to the natural magnetic repulsion of two bubbles of identical polarity. Thus, employment of the present invention results in a highly miniaturized bubble domain device which is compatible with integrated circuitry, and wherein the cell design on the basis of an area of W time 2W is 32 times the denser than that of the typical T-bar-I-bar circuits in which the cell dimensions are 8W times 8W.

Figure 2:
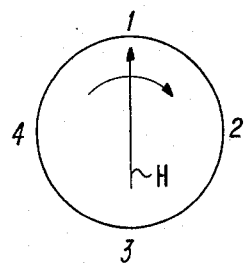
FIG. 2 is a schematic representation of a rotating magnetic field vector for propagating magnetic bubble domains in the gapless propagation structure of FIG. 1.

With reference to FIG. 2, which shows in schematic fashion the propagation field vector H in terms of the rotational phase positions, being in sequence, phase positions 1, 2, 3, 4 and back to 1 in clockwise rotational fashion, the effect of such rotation on bubbles moving along the longitudinally undulating periphery of strip 14 of FIG. 1 may be readily appreciated. Consider that the propagation field or H vector is at phase 1 and a magnetic bubble domain of negative polarity 34 exists at the center position 1 of semi-circular portion 22 of the upper edge 18 of the permalloy strip 14. As the field vector rotates through phase 2 to phase 3, the bubble 34 will "follow the poles" in the usual manner and move in a clockwise direction, from a position intermediate the center of the semi-circular edge portion 22 and intersection 30 between semi-circular edge portions 22 and 24 to location designations 1, 2 and 3 about the periphery of edge 18. As the field vector, FIG. 2, continues on to phase 4, the bubble continues to move longitudinally in the same direction but along the periphery of a new semi-circular edge portion, that is, the next downstream semi-circular edge portion 24 to position 4. The bubble 34 reaches the center of semi-circle 24 in response to a complete or full rotation of the H vector, that is, back to position 1 indicated in FIG. 2.

With respect to strip 14, and the first and second cells 14a and 14b, assuming the state as illustrated in terms of bubble 34 in solid line with the vector position indicated in FIG. 2, a strong positive magnetic pole is created within strip 14 by the magnetic field at vector position 1 at the top of cells 14a and 14b and strong negative poles indicated by the minus signs are created at the bottom of these cells. With the bubble 34 at the center of semi-circle 22 being negative (and in fact all bubbles being negative), it is obvious that bubble 34 seeks a center position or the position of maximum positive polarity concentration of the field within a given cell of permalloy strip 14. In terms of bubble 34, the rotary propagation field or vector, in moving from phase 1 to phase 2 under a clockwise rotation, causes cell 14a in the vicinity of the position marked 2 of the undulating edge 18 to be highly positive, while within cell 14b and adjacent semi-circular edge portion 24, in the vicinity of the position defined by numeral 4, the field at this area is relatively negative. Due to the conflicting positive and negative fields acting upon bubble 34, it will seek a position intermediate of the intersection point 30 and the center of semi-circle 22. Next, when the propagation field or H vector rotates clockwise to a further phase position 3, reverse polarity occurs, that is, the top of cells 14a and 14b become negative and their bottoms become positive. Since bubble 34 is negative, it seeks a position as close as possible to the positive pole, nearest the bottom center of cells 14a and 14b or, in terms of repulsion, tends to move away from the areas of maximum negative polarity for the applied field, that is, a movement away from a top center position identified by numeral 1 with respect to both cells 14a and 14b. Thus, bubble 34 moves to position 3 at the intersection 30 of semi-circular edge portions 22 and 24. Further, rotation of the propagation field or H vector to phase position 4 creates the opposite effect as that when the H vector is in phase position 2, FIG. 2. That is, the polarity at position 4 within the upper half of cell 14b is more positive than the polarity at position 2 of the upper cell 14a and the effect on bubble 34 is to move from semi-circular edge portion 22 to the next adjacent semi-circular edge portion 24. Further rotation of the propagation field or H vector back to the phase position 1 causes bubble 34 to reach the position indicated in phantom line fashion at 34' on the periphery of semi-circular edge portion 24, completing one cycle of propagation movement along the upper convoluted edge 18.

With respect to lower bubble 36, initially shown in full line fashion at the intersection point 32 of semi-circular edge portions 26 and 28, since in position 1 both cells 14a and 14b are highly negative at their bottoms in contrast to the top of the cells, the bubble 36 tends to move to intersection 32 by repulsion. Numerals 1, 2, 3 and 4, indicate the sequence of movement of bubble 36 along the periphery or edge 20 of strip 14 from right to left in response to the propagation field or H vector rotating from position 1 to position 4. It is to be noted that as the field vector rotates clockwise, the bubbles 34 and 36 follow the poles in the usual manner moving in a clockwise direction along the semi-circular path created by the edge undulations. The intersection points between adjacent semi-circular edge portions while being aligned with each other in terms of the upper and lower edges, are spread sufficiently so that the bubble will not traverse the width of the strip, that is, move from the upper edge to the lower edge or vice versa. Further, while only a portion of strip 14 is shown including two convolutions, it is obvious that the strip may be of any length and that a complete loop may be formed by employing semi-circular convolutions at opposed ends of strip 14. A simple analysis will also reveal that the direction of bubble circulation along the edges of the strip 14 can be reversed simply by rotating the field vector in the opposite or counterclockwise direction. Although it is not shown, a bubble can be added or removed from the strip by a conventional means such as the employment of an anniliator/generator (not shown) which may be provided at a desired point to implement bubble destruction or generation. With the embodiment of FIG. 1, the same rotating propagation field can cause a simultaneous movement of bubbles in opposite directions in terms of the upper and lower edges of strip 14 and in which case, bubbles within each cell will move identically in terms of the adjacent cell advancing as the field vector rotates. The reversal of the field vector of FIG. 2 to a counterclockwise direction merely reverses the direction of bubble circulation along the upper and lower edges 18 and 20. The propagation velocity remains the same and no additional field vector rotations are required to advance a bubble from one cell or stage to the next.

The practical utilization of the propagation structure disclosed in FIG. 1 may be accomplished in the usual manner, i.e., with the presence of a bubble representing a logical "one" and the absence of a bubble representing a logical "zero". Sensing may be implemented by magneto-resistive or other well known elements.

Figure 3:
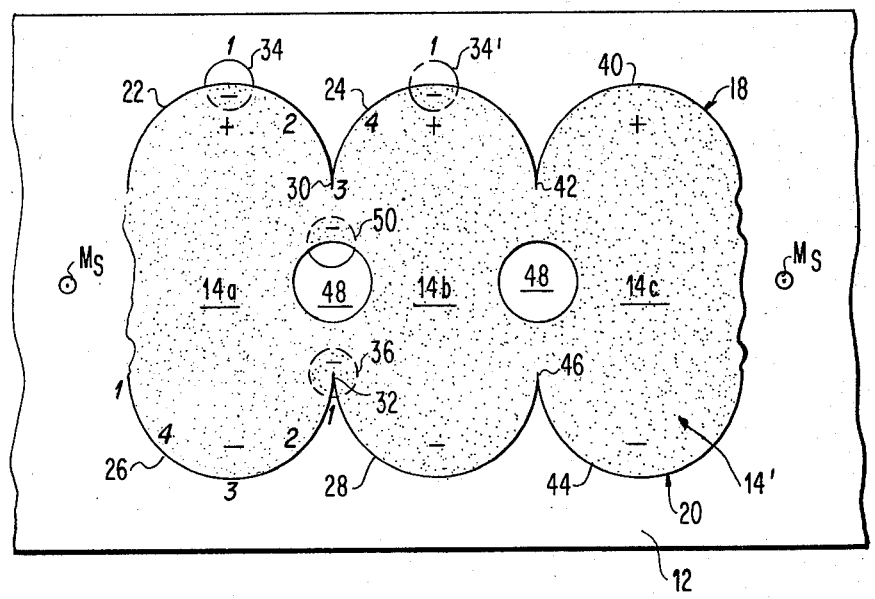
FIG. 3 is a top plan view of a gapless propagation structure in accordance with the second embodiment of the invention.

Referring next to FIG. 3, a second embodiment of the present invention is illustrated in the form of a domain propagation arrangement in generally the same fashion as the embodiment of FIG. 1. In that respect, like elements are given like numerical designations. Thus, a sheet or platelet of magnetic material 12 may be formed of a material such as orthoferrite, garnet or the like, and again, a magnetic field of sufficient magnitude to support bubble domains extends up through the platelet 12 and normal thereto as indicated by arrowheads $M_S$. A strip 14' of permalloy or other magnetically soft material may be formed directly on the surface of the platelet 12 or may be slightly spaced therefrom by an insulating layer, strip 14' again being provided with oppositely undualting longitudinal edges in the form of linked outwardly convex semi-circular edge portions constituting, in this case, semi-circular edge portions 22 and 24, for instance, intersecting at 30, while on the opposite edge 20 semi-circular edge portions 26 and 28 intersect at 32. FIG. 3 illustrates in addition to cells 14a and 14b created thereby, a third cell 14c in the downstream direction having upper semi-circular edge portion 40 intersecting edge portion 24 at 42 while lower edge 20 has a semi-circular edge portion 44 intersecting edge portion 28 at 46. A bubble 34 is indicated as being positioned along the periphery or edge 18 of the strip 14', centered at position No. 1 on edge portion 22, representative of propagation field or H vector, FIG. 2, being at phase 1. It is noted that bubble 34 moves in sequence from left to right along edges 22 and 24 through positions 2, 3 and 4 and back to position 1 of the next adjacent cell 14b from 14a in response to a full rotation of the propagation field. In this case, however, a cavity 48 in the form of a circular hole is created inside the propagation channel formed by strip 14 at each intersection between adjacent semi-circular edge portions, the cavity or circular hole 48 being positioned intermediate the opposed edges. A dummy bubble, as at 50 may be placed thereon to assist in guiding the domain 34 moving along the strip periphery or edges 18 and 20.

The effect of this may be readily seen in conjunction with FIG. 3 particularly with respect to the more detailed description given with respect to the embodiment of FIG. 1. With the bubbles 34, 36 and 50 being negative, all the bubbles will seek a position most remote from the negative polarity portions of the cells 14a, 14b and 14c. In this case, at phase 1, bubble 34 seeks an upper center position with respect to cell 14a, bubble 50 seeks a position centered with intersection 30 and at the top of circular cavity 48 while bubble 36 seeks a position at the intersection 32 of the two semi-circular edge portions 26 and 28. It must be kept in mind that since the domains 50 and 36 are both negative, they tend to repel each other. In this case, the bubble 36 is prevented from traversing across the strip 14' from one propagation path or edge 20 to the other 18 due to the magnetostatic interaction between bubbles and the presence of bubble 50 at the edge of the cavity 48. As the propagation field rotates clockwise, the dummy bubble 50 will rotate clockwise and complete one circle about the edge of cavity 48 maintained within the propagation channel created by strip 14' and following the in-plane magnetic field. In all other respects, the embodiment of FIG. 3 acts in the same manner as the embodiment of FIG. 1.

With respect to the strip 14', and cells or stages 14a, 14b and 14c, the dimensions are identical to that of FIG. 1. The transverse dimension that is at right angles to the longitudinal axis of the strip is equal to 2W or twice the line width, while the diameter of the semi-circular edge portion of each cell and thus the dimension in the direction of the longitudinal axis is equal to the line width W. In this case, extreme miniaturization is achieved, with the line width being limited only to lithography rather than bubble size.

Figure 4:
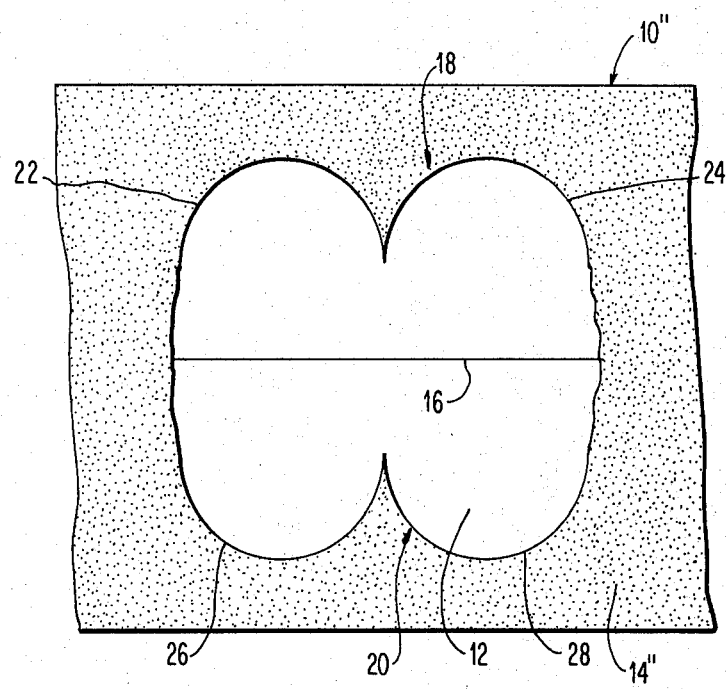
FIG. 4 is a top plan view of a gapless propagation structure in accordance with yet another embodiment of the present invention.

What has been shown is an improved propagation means for magnetic bubble domains, which has very small cell size, thereby providing high density. Although this propagation structure is conveniently comprised of magnetically soft material, many alternatives are available. For instance, an aperatured layer of magnetically soft material can be used, where the cells 14a and 14b are regions where no magnetically soft material is present, while the surrounding areas are of magnetically soft material. Reference to FIG. 4 shows an alternate embodiment of the invention, wherein a domain propagation arrangement indicated generally at 10" comprises a sheet or platelet 12 of a material of orthoferrite, garnet or the like, in which single wall domains may be moved, and extending across the upper surface of the platelet 12 is a strip 14" of permalloy or other magnetically soft material in much the same manner as the embodiment of FIG. 1, except in this case, the embodiment is inside out, that is, the strip 14" or permalloy is apertured irregularly to expose to view a portion of the underlying sheet or platelet 12 of orthoferrite, garnet or the like. Thus, it is the inner undulating edges of strip 14'' defined by the apertures within that strip as at 18 and 20 which form bubble domain propagation paths, permitting the bubbles to move along the apertured periphery of the strip and in either direction parallel to the longitudinal axis 16 of the aperture. The undualtions of respective edges 18 and 20 are in phase, that is, their peaks and valleys coincide longitudinally as in the manner of the embodiment of FIG. 1. The undulations take the form of linked semi-circles as at 22 and 24 for upper edge 18 and as at 26 and 28 for lower edge 20. Also, the semi-circular edge portions in terms of their diameters and their lateral spacing have the same relationship as described in detail with reference to the embodiment of FIG. 1. The operation and the manner of propagation of the domains is identcal with respect to both emodiment. As another alternative, ion implantation or diffusion of impurities into a magnetic bubble domain material can be used to create the propagation structure. For instance, regions 14a and 14b, etc., can be ion-implanted regions of the bubble domain material while areas outside of regions 14a and 14b, and regions 48, are not subjected to ion-implantation.

What is claimed is:

1. A gapless propagation structure for implementing continuous movement of magnetic bubble domains in a supporting material in response to a reorienting in-plane magnetic field, the structure comprising:
    a continuous elongated strip of magnetically soft material having opposed longitudinally undulating edges with said undulations in phase, each undulating edge forming a bubble domain propagation path, said undulations being in the form of linked, outwardly convex circular edge portions facing away from each other, and wherein the minimum diameter of each circular edge portion and the minimum lateral distance between opposed longitudinal undulating edges is on the order of four times the diameter of said bubble domains.

2. The gapless propagation structure as defined in claim 1, further comprising cavities within said strip at longitudinally spaced positions corrresponding to the minimum lateral gap position between said undulations, said cavities supporting a dummy bubble domain to thereby guide the domains moving along said undulating edges and prevent transverse migration of said domains between said edges.

3. A gapless propagation structure for implementing continuous movement of magnetic bubble domains in a supporting material in response to a reorienting in-plane magnetic field, the structure comprising:
    a continuous elongated strip of magnetically soft material, at least one longitudinally undulating edge in the form of linked, outwardly convex circular edge portions, forming a bubble domain propagation path, cavities within said strip at longitudinally spaced positions to captively support a dummy bubble domain and to thereby guide the domains moving along said at least one undulating edge and to prevent transverse migration of said domains, said cavities comprising circular holes aligned with the intersections of adjacent circular edge portions.

4. The gapless propagation structure as defined in claim 3, wherein said undulations are outwardly convex to define individual cells therebetween.

5. The gapless propagation structure as defined in claim 3, wherein said undulations are in the form of linked outwardly convex circular edge portions.

6. A gapless propagation structure for implementing movement of magnetic bubble domains in a supporting medium in response to the application of a reorienting magnetic field in said medium, comprising:
    a continuous layer along which magnetic poles causing said domain movement can be established by said reorienting magnetic field, said layer being characterized by opposed longitudinally undulating edges along which magnetic poles are created in response to various orientations of said magnetic field, said undulations being in phase with domain movement being in different directions aong said opposed edges of said layer and wherein the minimum lateral distance between said opposed undulating edges is on the order of four times the diameter of the magnetic bubble domain.

7. The structure of claim 6, where said layer is comprised of magnetically soft material.

8. The structure of claim 6, further including means positioned between said undulating edges and located longitudinally at positions corresponding to minimum gap dimensions between said undulating edges for trapping domains such that the trapped domains interact with said domains which move along the edges of said layer.

9. The structure of claim 6, where said undulating edges have generally circular geometry.

10. A gapless propagation structure for moving magnetic bubble domains in a supporting medium, comprising:
    a magnetic medium in which said bubble domains can be propagated,
    a plurality of disk shaped elements which overlap each other to define a continuous propagation strip having opposing edges which are comprised of generally circular sections along which magnetic poles for movement of said domains can be established by a reorienting magnetic field substantially in the plane of said magnetic medium, the locus of said magnetic poles being a plurality of curved paths which intersect each other,
    said overlapped circular sections defining opposed undulations which are in phase with each other, and are characterized by each curved path being of a minimum diameter equal to approximately four times the diameter of a magnetic bubble domain, and wherein the minimum distance between said undulations is approximately four times the diameter of said magnetic bubble domain.

11. The structure of claim 10, further including an element located between said opposing edges for holding a bubble domain thereat, said held bubble domain being sufficiently close to bubble domains moving along said locus of magnetic poles to interact therewith.

12. The structure of claim 10, where said bubble domain holding element is comprised of magnetically soft material.

13. A magnetic bubble domain apparatus for moving said domains in a magnetic medium, comprising:
    a layer of magnetically soft material located adjacent to said magnetic medium, said layer having an elongated aperture therein which has opposing edges that are comprised of linked generally circular sections along which successive magnetic poles are created by reorienting said linked magnetic field in the plane of said layer, said linked circular sections defining opposed undulations which are in phase with each other and being characterized by each circular section having a minimum diameter equal to approximately four times the diameter of a magnetic bubble domain and wherein the minimum distance between said undulations is approximately four times the diameter of said magnetic bubble domain.

14. A structure for moving bubble domains in a magnetic medium, wherein said structure has magnetic poles created along it in response to a reorienting magnetic field, comprising:

a magnetic medium in which said bubble domains can be moved, a layer of magnetically soft material adjacent to said medium having overlapping apertures therein which are circular in form to define opposed undulations which are in phase with each other and wherein each circular aperture has a minimum diameter equal to approximately four times the diameter of a magnetic bubble domain and wherein the minimum lateral distance between said opposed undulations is approximately four times the diameter of said magnetic bubble domain.

* * * * *

UNITED STATES PATENT OFFICE
CERTIFICATE OF CORRECTION

Patent No. 3,996,572     Dated December 7, 1976

Inventor(s) George E. Keefe et al.     Page 1 of 2

It is certified that error appears in the above-identified patent and that said Letters Patent are hereby corrected as shown below:

Column 3, line 58: delete "apprediated" and insert -- appreciated --

Column 5, line 55: delete "undualting" and insert -- undulating --

Column 6, line 54: delete "aperatured" and insert -- apertured --

Column 7, line 8: delete "undualtions" and insert -- undulations -- line 17: delete "identcal" and insert -- identical -- line 18: delete "emodiment" and insert -- embodiments --

UNITED STATES PATENT OFFICE
CERTIFICATE OF CORRECTION

Patent No. 3,996,572                 Dated December 7, 1976

Inventor(s)   George E. Keefe et al.        Page 2 of 2

It is certified that error appears in the above-identified patent and that said Letters Patent are hereby corrected as shown below:

Column 8, line 15; delete "aong" and insert

-- along --.

Signed and Sealed this

Tenth Day of May 1977

[SEAL]

*Attest:*

RUTH C. MASON
*Attesting Officer*

C. MARSHALL DANN
*Commissioner of Patents and Trademarks*